(12) United States Patent
Gu et al.

(10) Patent No.: US 9,905,789 B2
(45) Date of Patent: *Feb. 27, 2018

(54) WHITE-LIGHT-EMITTING COMPOSITE FILM COMPRISING POLYFLUORENE DERIVATIVES AND RED LIGHT QUANTUM DOTS, ITS MANUFACTURE METHOD, AND WHITE LIGHT ORGANIC ELECTROLUMINESCENT DEVICE

(71) Applicant: BOE Technology Group Co., Ltd., Beijing (CN)

(72) Inventors: Jingxia Gu, Beijing (CN); Juanjuan You, Beijing (CN); Chen Tang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/418,256

(22) PCT Filed: Jun. 25, 2014

(86) PCT No.: PCT/CN2014/080748
§ 371 (c)(1),
(2) Date: Jan. 29, 2015

(87) PCT Pub. No.: WO2015/058544
PCT Pub. Date: Apr. 30, 2015

(65) Prior Publication Data
US 2016/0005989 A1 Jan. 7, 2016

(30) Foreign Application Priority Data
Oct. 21, 2013 (CN) .......................... 2013 1 0495591

(51) Int. Cl.
*H01L 29/06* (2006.01)
*H01L 31/00* (2006.01)
(Continued)

(52) U.S. Cl.
CPC ............ *H01L 51/502* (2013.01); *C09K 11/06* (2013.01); *C09K 11/08* (2013.01);
(Continued)

(58) Field of Classification Search
CPC ... C08K 3/30; C08K 2003/3036; C08L 65/00; H01L 51/0003; H01L 51/502;
(Continued)

(56) References Cited

U.S. PATENT DOCUMENTS 5,998,045 A * 12/1999 Chen ...................... C09K 11/06
313/504
7,843,128 B2 * 11/2010 Ookawa .............. H01L 51/5052
313/504
(Continued)

FOREIGN PATENT DOCUMENTS

CN 101810056 A 8/2010
CN 101937975 A 1/2011
(Continued)

OTHER PUBLICATIONS

English translation of KR-2013/0039340.*
(Continued)

*Primary Examiner* — Ismail Muse
(74) *Attorney, Agent, or Firm* — Banner & Witcoff, Ltd.

(57) ABSTRACT

Disclosed are a light-emitting composite film, its manufacture method, and a white light organic electroluminescent device. Said light-emitting composite film comprises a first light-emitting layer and a second light-emitting layer. The first light-emitting layer comprises polyfluorene or polyfluorene derivatives, and the second light-emitting layer com-
(Continued)

prises quantum dots. A variety of color gamut and an improved brightness of devices can be achieved by the light-emitting composite film.

5 Claims, 2 Drawing Sheets

(51) Int. Cl.
*H01L 51/50* (2006.01)
*H01L 51/00* (2006.01)
*C09K 11/06* (2006.01)
*C09K 11/08* (2006.01)
*H01L 51/56* (2006.01)

(52) U.S. Cl.
CPC ...... *H01L 51/0007* (2013.01); *H01L 51/0039* (2013.01); *H01L 51/504* (2013.01); *H01L 51/56* (2013.01); *C09K 2211/14* (2013.01); *H01L 2251/301* (2013.01); *Y02B 20/181* (2013.01)

(58) Field of Classification Search
CPC ..... H01L 51/0039; H01L 51/50; H01L 51/56; C08G 2261/3142; C08G 2261/5222; C09K 11/565
See application file for complete search history.

(56) References Cited

U.S. PATENT DOCUMENTS

| | | | | |
|---|---|---|---|---|
| 2003/0044645 | A1* | 3/2003 | Kambe | C09K 11/06 428/690 |
| 2005/0001538 | A1 | 1/2005 | Ozkan et al. | |
| 2005/0142380 | A1* | 6/2005 | Chin | C09K 11/06 428/690 |
| 2005/0236981 | A1* | 10/2005 | Cok | H01L 27/3213 313/504 |
| 2006/0046092 | A1* | 3/2006 | Towns | C07C 13/70 428/690 |
| 2006/0231844 | A1* | 10/2006 | Carter | H01L 27/3288 257/79 |
| 2008/0007162 | A1* | 1/2008 | Ookawa | H01L 51/5052 313/504 |
| 2008/0238299 | A1* | 10/2008 | Cho | B82Y 20/00 313/503 |
| 2008/0278063 | A1* | 11/2008 | Cok | B82Y 20/00 313/500 |
| 2008/0280162 | A1* | 11/2008 | Morii | H01L 51/0575 428/690 |
| 2009/0008628 | A1* | 1/2009 | Choi | B82Y 20/00 257/13 |
| 2009/0308456 | A1* | 12/2009 | Rand | H01L 51/0038 136/261 |
| 2009/0314991 | A1* | 12/2009 | Cho | C09D 11/36 252/301.36 |
| 2010/0090195 | A1* | 4/2010 | Parsapour | H01L 51/502 257/13 |
| 2010/0117110 | A1* | 5/2010 | Park | B82Y 20/00 257/98 |
| 2010/0177496 | A1* | 7/2010 | Gillies | F21K 9/232 362/84 |
| 2010/0190281 | A1* | 7/2010 | Ishida | H01L 27/3274 438/29 |
| 2010/0200869 | A1* | 8/2010 | Sekiya | H01L 27/3246 257/88 |
| 2010/0213437 | A1* | 8/2010 | Akai | B82Y 20/00 257/13 |
| 2010/0213438 | A1* | 8/2010 | Cho | B82Y 20/00 257/13 |
| 2011/0023932 | A1* | 2/2011 | Fukui | H01G 9/2081 136/244 |
| 2011/0291071 | A1* | 12/2011 | Kim | H01L 51/502 257/13 |
| 2012/0068121 | A1* | 3/2012 | Sparrowe | C08G 61/02 252/501.1 |
| 2012/0138894 | A1* | 6/2012 | Qian | H01L 51/502 257/13 |
| 2012/0175588 | A1* | 7/2012 | Qiao | C09K 11/883 257/13 |
| 2012/0267616 | A1* | 10/2012 | Jang | B82Y 20/00 257/40 |
| 2013/0146838 | A1* | 6/2013 | Ku | H01L 31/035218 257/13 |
| 2013/0200348 | A1* | 8/2013 | Pillow | C07C 13/567 257/40 |
| 2013/0203198 | A1* | 8/2013 | Min | H01L 51/428 438/46 |
| 2014/0014896 | A1* | 1/2014 | Chung | H01L 33/14 257/13 |
| 2014/0145145 | A1* | 5/2014 | Lee | H01L 51/5012 257/13 |
| 2014/0246664 | A1* | 9/2014 | Shoda | H01L 27/3288 257/40 |
| 2014/0302627 | A1* | 10/2014 | Ko | H01L 51/502 438/35 |
| 2014/0306179 | A1* | 10/2014 | Demir | H01L 51/502 257/13 |
| 2015/0021551 | A1* | 1/2015 | Breen | C09K 11/595 257/14 |
| 2015/0107674 | A1* | 4/2015 | Lee | H01L 51/0034 136/263 |
| 2015/0228697 | A1* | 8/2015 | Liu | H01L 27/322 257/40 |
| 2015/0295035 | A1* | 10/2015 | Ono | H01L 29/78696 136/252 |
| 2015/0325803 | A1* | 11/2015 | Lee | H01L 51/0096 257/40 |
| 2015/0329774 | A1* | 11/2015 | Gu | B05D 1/005 252/301.33 |
| 2015/0380654 | A1* | 12/2015 | Tang | H01L 51/502 257/13 |
| 2016/0181482 | A1* | 6/2016 | Borrelli | C09K 11/025 257/98 |
| 2016/0301011 | A1* | 10/2016 | Nakaie | H01L 51/0059 |
| 2016/0301024 | A1* | 10/2016 | He | H01L 51/502 |
| 2016/0365534 | A1* | 12/2016 | Gao | H01L 51/52 |

FOREIGN PATENT DOCUMENTS

| | | |
|---|---|---|
| CN | 102723440 A | 10/2012 |
| CN | 103500803 A | 1/2014 |
| CN | 103904178 * | 4/2014 |

OTHER PUBLICATIONS

Google English Translation of Patent Applicaiton CN103904178.*
Oct. 10, 2014—(CN) First Office Action for Appn 201310495591.X with Eng Tran.
Apr. 28, 2015—(CN) Second Office Action for Appn 201310495591.X with Eng Tran.
International Search Report and Written Opinion dated Sep. 3, 2014 (PCT/CN2014/080748); ISA/CN.
Apr. 26, 2016—International Preliminary Report on Patentability Appn PCTCN2014080748.

* cited by examiner

WHITE-LIGHT-EMITTING COMPOSITE FILM COMPRISING POLYFLUORENE DERIVATIVES AND RED LIGHT QUANTUM DOTS, ITS MANUFACTURE METHOD, AND WHITE LIGHT ORGANIC ELECTROLUMINESCENT DEVICE

The application is a U.S. National Phase Entry of International Application No. PCT/CN2014/080748 filed on Jun. 25, 2014, designating the United States of America and claiming priority to Chinese Patent Application No. 201310495591.X filed on Oct. 21, 2013. The present application claims priority to and the benefit of the above-identified applications and the above-identified applications are incorporated by reference herein in their entirety.

TECHNICAL FIELD

Embodiments of the present invention relate to a light-emitting composite film, its manufacture method, and a white light organic electroluminescent device.

BACKGROUND

At present, application of white light organic electroluminescent devices in display and illumination has become a new direction for future display and illumination technology. Multi-band, color stability, and high efficiency are required for applications of white light organic electroluminescent devices in display and illumination technology, so as to meet requirements of display technology such as high color gamut.

White light is obtained by combination of red, green, blue and yellow lights. In general, a variety of colors are achieved by respective light-emitting materials, which can be co-doped to realize white light emission. A white light organic electroluminescent device may employ red, blue and green light-emitting organic fluorescent dyes in the light emitting layer. However, the chemical stability of such materials is poor, which results in low color gamut of the white light organic electroluminescent device. Additionally, the brightness of the above organic fluorescent dyes is low, which leads to low brightness of the white light organic electroluminescent device.

SUMMARY

At least one embodiment of the present invention provides a light-emitting composite film, its manufacture method, and a white light organic electroluminescent device, which achieves a variety of color gamut and improves the brightness of the device.

At least one embodiment of the present invention provides a light-emitting composite film, which comprises a first light-emitting layer comprising polyfluorene or its derivatives and a second light-emitting layer comprising quantum dots.

At least one embodiment of the present invention provides a manufacture method for a light-emitting composite film, which includes: making a solution of polyfluorene compounds by dispersing polyfluorene or its derivatives in a first solvent, and making a solution of quantum dots by dispersing quantum dots in a second solvent; preparing a first light-emitting layer by removing the first solvent from the solution of polyfluorene compounds; and preparing a second light-emitting layer on the first light-emitting layer by removing the second solvent from the solution of quantum dots.

At least one embodiment of the present invention provides a white light organic electroluminescent device which comprises the above light-emitting composite film.

BRIEF DESCRIPTION OF THE DRAWINGS

In order to more clearly explain the embodiments of the present invention, some drawings related to the embodiments of the invention will be briefly described. Apparently, the drawings described below merely involve some embodiments of the present invention, and should not be understood as limitations on the present invention.

DETAILED DESCRIPTION

In order to make the aim, the technical details and the advantages of the embodiments of the invention apparent, the technical solutions of the embodiments will be described in a clearly and fully understandable way in connection with the drawings related to the embodiments of the invention. Apparently, the described embodiments are just part of but not all of the embodiments of the invention. Based on the described embodiments herein, those skilled in the art can obtain other embodiments without any inventive work, which should be within the scope of the invention.

Figure 1:
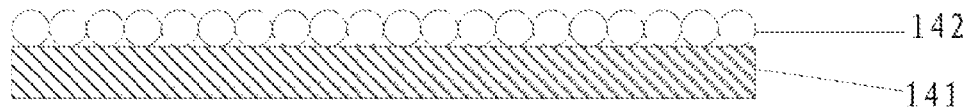
FIG. 1 is a structurally schematic diagram of a light-emitting composite film provided by an embodiment of the present invention.

At least one embodiment of the present invention provides a light-emitting composite film as shown in FIG. 1. Said light-emitting composite film comprises a first light-emitting layer 141 and a second light-emitting layer 142. Said first light-emitting layer 141 comprises polyfluorene or its derivatives, and said second light-emitting layer 142 comprises quantum dots.

For example, said polyfluorene derivatives may include: poly(9,9-dialkylfluorene), poly(dihexylfluorene-co-anthracene), polyfluorenes with biphenyl dendron side chains, tetraalkyl-substituted polyindenofluorenes, aryl-substituted polyindenofluorenes, polyfluorenes with anthracene-alkyl fluorene emission block connected to triphenylamine at both ends, polyfluorenes with anthracene-alkyl fluorene emission block connected to oxadiazole at both ends, poly(fluorene-alt-bithiophene), poly(dioctylfluorene-alt-benzothiadiazole), or poly(fluorene-co-phenylpyridine) bearing an iridium complex in the polymer backbone; or said polyfluorene derivatives may include: binary or ternary random copolymers of fluorene and thiophene (Th), ethylenedioxythiophene (EDT), 4,7-dithienyl-2,1,3-benzothiadiazole (DBT), or 4,7-dithienyl-2,1,3-benzoselenadiazole (BTSe).

For example, said quantum dots include nanoparticles comprising compound(s) of Group II element and Group VI element or compound(s) of Group III element and Group V element. Nanoparticles comprising compound(s) of Group II element and Group VI element or compound(s) of Group III element and Group V element include semiconductor materials of compounds of Group II element Zn, Cd or Hg and Group VI element S, Se or Te. The chemical formula of compounds of Group II element and Group VI element is A(II)B(VI), that is ZnS, ZnSe, ZnTe, CdS, CdSe, CdTe, HgS, HgSe or HgTe. Nanoparticles comprising compounds of Group III element and Group V element include semiconductor materials of compounds of Group III element B, Al, Ga or In and Group V element N, P, As or Sb. The chemical formula of compounds of Group III element and Group V element is A(III)B(V), such as BN, BP, BAs, BSb, AN, AlP, AlAs, AlSb, GaN, GaP, GaAs, GaSb, InAs, InN, InP and InSb.

Polyfluorene and its derivatives are blue-green light emitting materials because they have large energy band gaps. Because these molecules contain a rigid planar biphenyl unit, they have high fluorescence quantum yield in solid state (0.6-0.8) and exhibit high thermal and chemical stability. Quantum dots, also known as semiconductor nanocrystals, are a new type of semiconductor nanocrystals in the size of 1-10 nm. They exhibit unique photoluminescence and electroluminescence properties due to the quantum size effects and dielectric confinement effects. Compared to traditional organic fluorescent dyes, quantum dots have excellent optical properties such as high quantum yield, high photochemical stability, anti-photolysis, broad-band excitation, narrow-band emission, high color purity, and a tunable color of emitted light through quantum dot size control.

In the light-emitting composite film of a white light organic electroluminescent device provided by at least one embodiment of the present invention, white light emission is achieved by color complementation of quantum dots and polyfluorene (derivatives). The manufacture procedure is simple, and materials can be selected from a broad range, and the color gamut of the white light can be adjusted according to the requirements. For example, if the second light emitting layer is formed by quantum dot ZnS which emits red light, various polyfluorene or derivatives of polyfluorene can be selected to form the first light emitting layer. Thus, when a voltage is applied, a white light organic electroluminescent device is able to emit white light of various color gamut, which has a wide range of application. At the same time, because the fluorescence efficiencies of quantum dots and polyfluorene and derivatives of polyfluorene are extremely high, the luminescent efficiency of the light-emitting composite film composed of the above compositions is very high, and the brightness of the device is improved.

Figure 2:
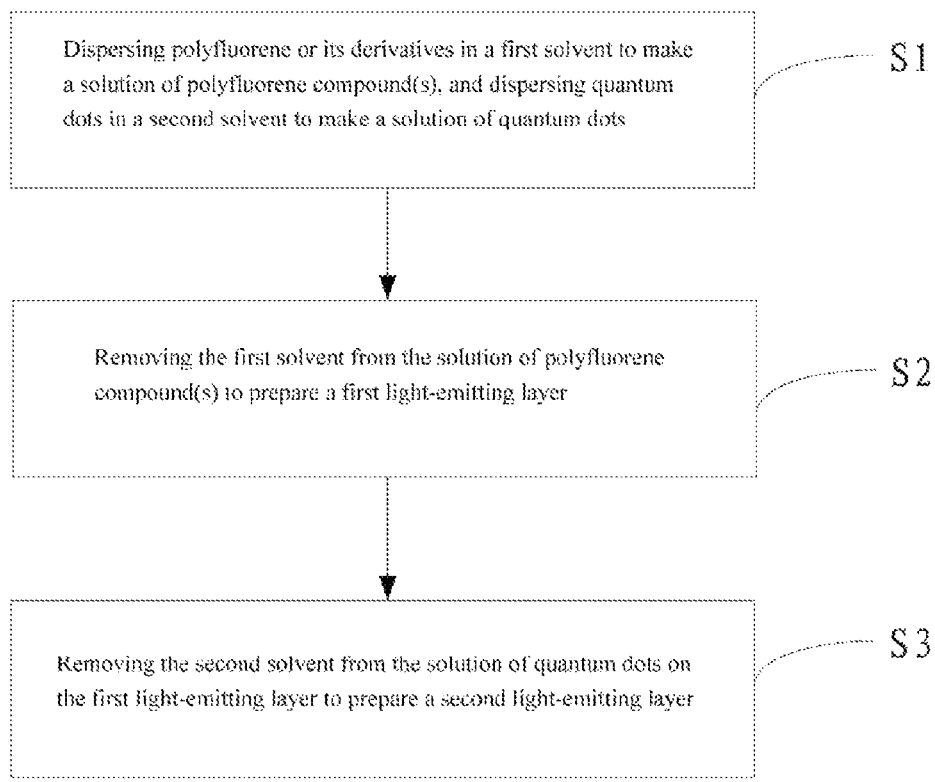
FIG. 2 is a flow chat of a manufacture method for a light-emitting composite film provided by an embodiment of the present invention.

At least one embodiment of the present invention provides a manufacture method of the above light-emitting composite film as shown in FIG. 2. Said method includes the following steps:

S1: making a solution of polyfluorene compounds by dispersing polyfluorene or its derivatives in a first solvent, and making a solution of quantum dots by dispersing quantum dots in a second solvent.

For example, said polyfluorene derivatives may include: poly(9,9-dialkylfluorene), poly(dihexylfluorene-co-anthracene), polyfluorenes with biphenyl dendron side chains, tetraalkyl-substituted polyindenofluorenes, aryl-substituted polyindenofluorenes, polyfluorenes with anthracene-alkyl fluorene emission block connected to triphenylamine at both ends, polyfluorenes with anthracene-alkyl fluorene emission block connected to oxadiazole at both ends, poly(fluorene-alt-bithiophene), poly(dioctylfluorene-alt-benzothiadiazole), or poly(fluorene-co-phenylpyridine); or said polyfluorene derivatives may include a binary or ternary random copolymer of fluorene and thiophene, ethylenedioxythiophene, 4,7-dithienyl-2,1,3-benzothiadiazole, or 4,7-dithienyl-2,1,3-benzoselenadiazole. Said first solvent includes toluene, chlorobenzene or chloroform. For example, the concentration of said solution of polyfluorene compound(s) is 3%-25%.

Said quantum dots include: compounds of Group II element and Group VI element and compounds of Group III element and Group V element. Said second solvent includes toluene, chlorobenzene or chloroform. The concentration of said solution of quantum dots is 4 mg/ml-30 mg/ml.

S2: Preparing a first light-emitting layer by removing the first solvent from said solution of polyfluorene compounds.

For example, a film can be formed by spin coating, ink jet printing, or printing said solution of polyfluorene compounds, and then the first light-emitting layer is manufactured by removing the first solvent from the film.

For example, the first light-emitting layer can be formed by first spin coating said solution of polyfluorene compounds onto a substrate, then evaporating the first solvent in the solution of polyfluorene compounds by treatment at a temperature from about 60° C. to about 150° C. for about 10 to 40 minutes, and finally cooling at room temperature.

S3: preparing a second light-emitting layer on the first light-emitting layer by removing the second solvent from said solution of quantum dots.

For example, a film can be formed by spin coating, ink jet printing, or printing said solution of quantum dots on the first light-emitting layer, and then the second light-emitting layer is manufactured by removing the second solvent from the film.

For example, the second light-emitting layer can be formed by first spin coating said solution of quantum dots onto the first light-emitting layer, then evaporating the second solvent in the solution of quantum dots by treatment at a temperature from about 60° C. to about 150° C. for about 10 to 40 minutes, and finally cooling at room temperature.

At least one embodiment of the present invention provides a white light organic electroluminescent device which comprises the above light-emitting composite film.

Figure 3:
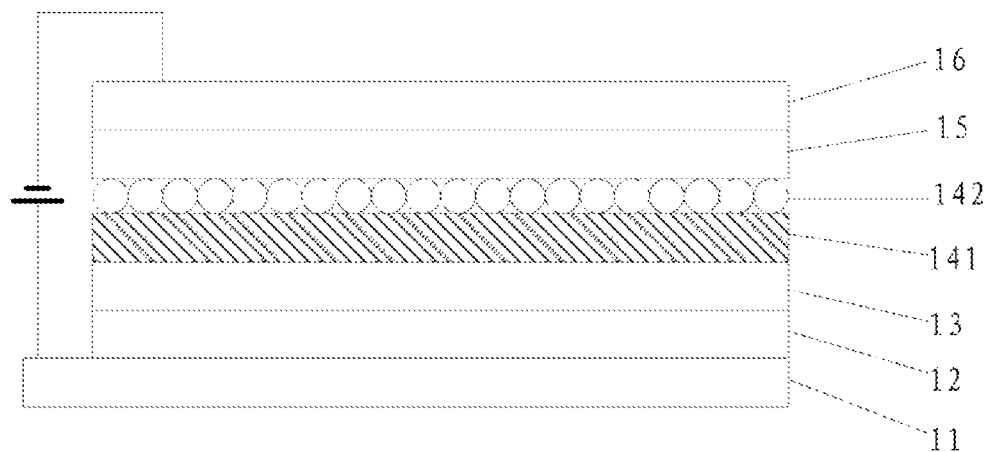
FIG. 3 is a structurally schematic diagram of a white light organic electroluminescent device provided by an embodiment of the present invention.

For example, as shown in FIG. 3, a white light organic electroluminescent device according to at least one embodiment of the present invention further includes: a substrate 11, an anode 12 and a cathode 16. The light-emitting composite film comprising a first light-emitting layer 141 and a second light-emitting layer 142 is located between the anode 12 and the cathode 16, and said first light-emitting layer 141 is located between the anode 12 and the second light-emitting layer 142. Said first light-emitting layer 141 includes polyfluorene or polyfluorene derivatives, and said second light-emitting layer 142 includes quantum dots.

In a white light organic electroluminescent device provided by at least one embodiment of the present invention, the light-emitting composite film is formed from the first light-emitting layer and the second light-emitting layer. When a certain voltage (e.g. from about 2 to 10V) is applied between the anode and the cathode, the first light-emitting layer 141, which is composed of polyfluorene and polyfluorene derivatives, emits blue-green light, thereby contributing to the short wavelength portion of the white spectrum; the second light-emitting layer 142, which is composed of quantum dots, emits red light, thereby contributing to the long wavelength portion of the white spectrum. White light spectrum can be obtained by complementation of red light from the second light-emitting layer and blue-green light from the first light-emitting layer.

For example, as shown in FIG. 3, a hole transport layer 13 can be further placed between the anode 12 and the light-emitting composite film, and an electron transport layer 15 can be further placed between the cathode 16 and the light-emitting composite film.

The invention has been described with reference to some exemplary embodiments which are not limitative to the scope of the disclosure. The scope of the disclosure is defined by the accompanying claims.

The present application claims the benefit of the Chinese Application No. 201310495591.X filed on Oct. 21, 2013, the entire disclosure of which is incorporated herein by reference.

The invention claimed is:

1. A white light organic electroluminescent device, including a white-light-emitting composite film, wherein the white-light-emitting composite film comprises a first light-emitting layer consisting of polyfluorene derivatives and a second light-emitting layer comprising red light quantum dots;
   wherein, said polyfluorene derivatives include: poly(dihexylfluorene-co-anthracene), polyfluorenes with biphenyl dendron side chains, tetraalkyl-substituted polyindenofluorenes, aryl-substituted polyindenofluorenes, polyfluorenes with anthracene-alkyl fluorene emission block connected to triphenylamine at both ends, polyfluorenes with anthracene-alkyl fluorene emission block connected to oxadiazole at both ends, poly(fluorene-co-phenylpyridine) bearing an iridium complex in the polymer backbone, or binary or ternary random copolymers of fluorene and thiophene, ethylenedioxythiophene, 4,7-dithienyl-2,1,3-benzothiadiazole, or 4,7-dithienyl-2,1,3-benzoselenadiazole;
   wherein, the device further includes an anode and a cathode, and the white-light-emitting composite film is located between the anode and the cathode; the first light-emitting layer is located between the anode and the second light-emitting layer;
   wherein a hole transport layer is further placed between the anode and the white-light-emitting composite film, and an electron transport layer is further placed between the cathode and the white-light-emitting composite film;
   wherein, said red light quantum dots include compounds of Group II element and Group VI element, or compounds of Group III element and Group V element.

2. A manufacture method for a white-light-emitting composite film, comprising,
   making a solution of polyfluorene compound(s) by dispersing polyfluorene derivatives in a first solvent, wherein a concentration of the solution of polyfluorene compound(s) is 3%-25%, and making a solution of quantum dots by dispersing quantum dots in a second solvent, wherein a concentration of the solution of quantum dots is 4 mg/ml-30 mg/ml;
   preparing a first light-emitting layer by removing the first solvent from the solution of polyfluorene compound(s), the first light-emitting layer consisting of polyfluorene derivatives; and
   preparing a second light-emitting layer on the first light-emitting layer by removing the second solvent from the solution of quantum dots;
   wherein, said polyfluorene derivatives include: poly(dihexylfluorene-co-anthracene), polyfluorenes with biphenyl dendron side chains, tetraalkyl-substituted polyindenofluorenes, aryl-substituted polyindenofluorenes, polyfluorenes with anthracene-alkyl fluorene emission block connected to triphenylamine at both ends, polyfluorenes with anthracene-alkyl fluorene emission block connected to oxadiazole at both ends, poly(fluorene-co-phenylpyridine) bearing an iridium complex in the polymer backbone, or binary or ternary random copolymers of fluorene and thiophene, ethylenedioxythiophene, 4,7-dithienyl-2,1,3-benzothiadiazole, or 4,7-dithienyl-2,1,3-benzoselenadiazole.

3. The method according to claim 2, wherein, the first light-emitting layer is manufactured by removing the first solvent after forming a film by spin coating, ink jet printing, or printing said solution of polyfluorene compound(s); and
   the second light-emitting layer is manufactured by removing the second solvent after forming another film by spin coating, ink jet printing, or printing the solution of quantum dots on the first light-emitting layer.

4. The method according to claim 2, wherein, said first solvent includes toluene, chlorobenzene or chloroform; and said second solvent is toluene, chlorobenzene or chloroform.

5. The method according to claim 3, wherein, said first solvent includes toluene, chlorobenzene or chloroform; and said second solvent is toluene, chlorobenzene or chloroform.

* * * * *